US012808845B2

(12) United States Patent
Pirner

(10) Patent No.: US 12,808,845 B2
(45) Date of Patent: Nov. 24, 2026

(54) CIRCUMFERENTIAL MAGNETIZER FOR A PIPELINE INSPECTION GAUGE

(71) Applicant: ENTEGRA LLP, Indianapolis, IN (US)

(72) Inventor: Paul Pirner, Mississauga (CA)

(73) Assignee: Entegra LLP, Indianapolis, IN (US)

( * ) Notice: Subject to any disclaimer, the term of this patent is extended or adjusted under 35 U.S.C. 154(b) by 163 days.

(21) Appl. No.: 18/798,537

(22) Filed: Aug. 8, 2024

(65) Prior Publication Data

US 2025/0052718 A1 Feb. 13, 2025

Related U.S. Application Data

(60) Provisional application No. 63/518,305, filed on Aug. 8, 2023.

(51) Int. Cl.
*G01N 27/83* (2006.01)
*G01R 33/02* (2006.01)

(52) U.S. Cl.
CPC ............. *G01N 27/83* (2013.01); *G01R 33/02* (2013.01)

(58) Field of Classification Search
None
See application file for complete search history.

(56) References Cited

U.S. PATENT DOCUMENTS 5,864,232 A 1/1999 Laursen
6,538,431 B2 3/2003 Couchman et al.
7,548,059 B2 6/2009 Thompson et al.
7,595,636 B2 9/2009 Barolak et al.
8,035,374 B1 10/2011 Girrell et al.
10,401,325 B2 9/2019 Thompson et al.
10,705,051 B2 7/2020 Thompson et al.
10,969,366 B2 4/2021 Thompson et al.
(Continued)

FOREIGN PATENT DOCUMENTS

CN 201697891 U 1/2011
CN 207908434 U 9/2018
(Continued)

OTHER PUBLICATIONS

Vectra AFI Flaw Inspection Services. Combine circumferentiral and axial MFL to accurately manage multiple pipeline integrity threats. In Baker Hughes. Process and Pipeline. Sep. 2012. (2 Pages).
(Continued)

*Primary Examiner* — Jas A Sanghera
(74) *Attorney, Agent, or Firm* — Maginot, Moore & Beck, LLP

(57) ABSTRACT

A circumferential magnetic flux leakage module for a pipeline inspection gauge includes a body defining a central axis and a plurality of magnetic bar assemblies arranged circumferentially on the body with respect to the central axis. Each of the plurality of magnetic bar assemblies includes a front bar structure and a rear bar structure with an elbow positioned between the front bar structure and the rear bar structure. The elbow separates the front bar structure from the rear bar structure and provides a circumferential offset between the front bar structure and the rear bar structure. Each of the front bar structure and the rear bar structure includes a central magnet, a north pole structure, a south pole structure, and a plurality of magnetic flux sensors.

20 Claims, 5 Drawing Sheets

(56) References Cited

U.S. PATENT DOCUMENTS

| | | | | |
|---|---|---|---|---|
| 11,346,810 | B2 | 5/2022 | Thompson et al. | |
| 2010/0060273 | A1* | 3/2010 | Couchman ............. | G01N 27/83<br>324/220 |
| 2010/0327859 | A1 | 12/2010 | Simek et al. | |
| 2012/0293289 | A1 | 11/2012 | Laursen et al. | |
| 2022/0146455 | A1 | 5/2022 | Thompson et al. | |
| 2025/0052718 | A1 | 2/2025 | Pirner | |

FOREIGN PATENT DOCUMENTS

| | | | |
|---|---|---|---|
| CN | 110857930 | A | 3/2020 |
| CN | 113640370 | A | 11/2021 |
| EP | 1913375 | B1 | 12/2008 |
| JP | 2017138099 | A | 8/2017 |
| KR | 101270177 | B1 | 5/2013 |

OTHER PUBLICATIONS

A long seam integrity assessment tool. In Pipeline Inspection & Testing, RoCorr Circumferential Magnetic Flux leakage ILI Tool. Aug. 2011. (2 Pages).

Written Opinion and Search Report corresponding to International Application No. PCT/US2024/041545, dated Dec. 18, 2024. (12 Pages).

Written Opinion and International Search Report corresponding to International Patent No. PCT/US2025/033601, dated Mar. 12, 2026. (11 Pages).

* cited by examiner

CIRCUMFERENTIAL MAGNETIZER FOR A PIPELINE INSPECTION GAUGE

CROSS-REFERENCE TO RELATED APPLICATIONS

This application claims priority from U.S. provisional patent application No. 63/518,305, filed Aug. 8, 2023.

FIELD

This application relates to the field of pipeline inspection gauges/tools, and particularly to modules configured to detect structural flaws and other defects in pipelines using circumferential magnetic flux leakage.

BACKGROUND

Pipeline systems are an integral component of global energy distribution. There are millions of miles of energy pipelines in the United States alone, delivering trillions of cubic feet of natural gas and hundreds of billions of ton/miles of liquid petroleum products each year. To ensure the safety of these vast pipeline systems, and often to comply with governmental regulations, pipeline operators must frequently service their pipelines and perform periodic inspections to assess pipeline integrity. Mechanical devices referred to as pipeline inspection gauges (which may also be referred to herein as "pigs" or "in-line inspection tools") are regularly employed to perform these maintenance and inspection functions inside the pipeline. Different types of pigs are used to perform different tasks. These pigs include gauging tool pigs, cleaning pigs, and smart pigs. Smart pigs are instrumented, electromechanical devices often referred to as inline inspection (ILI) tools that are used to inspect the pipeline for corrosion, metal loss, deformations, the position of the pipeline, and various other parameters as needed. Smart pigs are also typically propelled through the pipeline by the pressure of the product in the pipeline.

Pigs that utilize circumferential magnetic flux leakage (CMFL) techniques are particularly effective at identifying axial defects in pipelines (i.e., defects that are parallel to the axis defined by the pipeline) including metal loss, corrosion, cracks and other axial oriented anomalies. However, effectively and efficiently covering and monitoring the entire circumference of a pipeline with CMFL sensor modules can be challenging. These challenges include the difficulty in manufacturing the unique components of the CMFL sensor module and arrangement of the sensors and other components on the module. Therefore, it would be advantageous to provide a pig that effectively and efficiently uses CMFL technology to monitor pipeline defects.

SUMMARY

A circumferential magnetic flux leakage module for a pipeline inspection gauge is disclosed herein. The CMFL module includes a body defining a central axis and a plurality of magnetic bar assemblies arranged circumferentially on the body with respect to the central axis. Each of the plurality of magnetic bar assemblies includes a front bar structure and a rear bar structure with an elbow positioned between the front bar structure and the rear bar structure. The elbow separates the front bar structure from the rear bar structure and provides a circumferential offset between the front bar structure and the rear bar structure. Each of the front bar structure and the rear bar structure includes a central magnet, a north pole structure, a south pole structure, and a plurality of magnetic flux sensors.

In at least one embodiment disclosed herein, a pipeline inspection gauge comprises a towing section and at least one CMFL module coupled to the towing section. The at least one CMFL module includes a body defining a central axis and a plurality of magnetic bar assemblies arranged circumferentially on the body with respect to the central axis. Each of the plurality of magnetic bar assemblies includes a front bar structure and a rear bar structure with an elbow positioned between the front bar structure and the rear bar structure. The elbow provides a circumferential offset between the front bar structure and the rear bar structure on each magnetic bar assembly. Each front bar structure and rear bar structure includes a central magnet, a north pole structure, a south pole structure, and a plurality of magnetic flux sensors.

In at least one embodiment disclosed herein, a circumferential magnetizer is provided that is configured for insertion in a fluid pipeline. The circumferential magnetizer includes a body defining a central axis, and a plurality of magnetic bar assemblies arranged circumferentially on the body with respect to the central axis. Each of the plurality of magnetic bar assemblies includes a linear front bar structure and a linear rear bar structure with an offset positioned between the front bar structure. The offset results in the front bar structure being non-linear with the rear bar structure on each magnetic bar assembly.

The above described features and advantages, as well as others, will become more readily apparent to those of ordinary skill in the art by reference to the following detailed description and accompanying drawings. While it would be desirable to provide a circumferential magnetizer for a pipeline inspection gauge that provides one or more of these or other advantageous features as may be apparent to those reviewing this disclosure, the teachings disclosed herein extend to those embodiments which fall within the scope of any eventually appended claims, regardless of whether they include or accomplish one or more of the advantages or features mentioned herein.

DESCRIPTION

Figure 1:
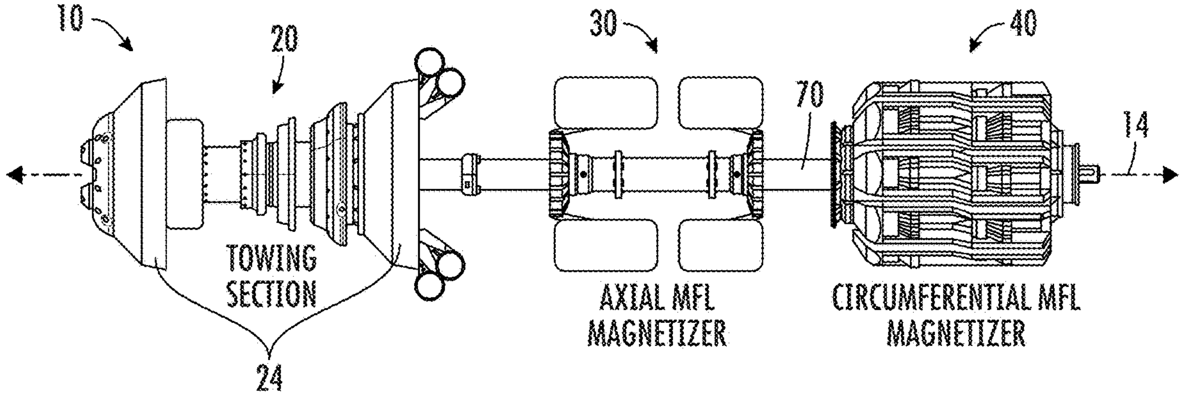
FIG. 1 shows a side view of a pig including a towing module, an axial magnetic flux leakage (MFL) magnetizer, and a circumferential MFL magnetizer.

With reference to FIG. 1, a pig 10 includes a plurality of modules/sections coupled together along a central axis 14. The plurality of modules include a towing section 20, an axial magnetic flux leakage (MFL) magnetizer 30, and at least one circumferential magnetic flux leakage (MFL) magnetizer 40. Couplings 70 extend between adjacent modules on the pig 10, and couple each of the modules (e.g., 30, 40) to the towing section 20.

The towing section 20 includes at least one drive cup. In the embodiments disclosed herein, the towing section 20 includes a plurality of cups 24 including a front drive cup and a rear drive cup (and in some embodiments there are more than 2 cups). The towing section 20 (which may also be referred to herein as a "towing module" or "drive section") is configured to be propelled through the pipeline along with fluid flowing through the pipeline. The couplings 70 link each of the additional modules (e.g., 30, 40) to the towing module 20, such that the towing module 20 pulls the additional modules 30, 40 along with it as it is propelled through the pipeline. In at least some embodiments, the towing section 20 may also be tethered to and/or towed by another module of the pig 10 (e.g., another module that is forward from the towing section 20). In at least some embodiments, the towing section also includes a drive mechanism in addition to the drive cup. Exemplary embodiments towing sections and associated drive cups are disclosed in U.S. Pat. Nos. 11,118,718, and 11,204,300, both assigned to Entegra LLP, the disclosures of which are incorporated herein by reference in their entirety.

The axial MFL magnetizer 30 (which may also be referred to herein as the "axial MFL section" or "axial MFL module") is coupled to the towing section 20, and is configured to impart an axially oriented magnetic flux along the pipeline and detect any resulting flux leakage associated with defects or other anomalies in the pipeline. The defects and anomalies detected by the axial MFL magnetizer are typically circumferential in nature. The axial MFL magnetizer 30 may be any of various types and configurations of axial MFL magnetizers as will be recognized by those of ordinary skill in the art (e.g., any of various solid core or magnet bar type magnetizers). An exemplary embodiment of an axial MFL magnetizer is disclosed in U.S. Pat. No. 10,401,325, assigned to Novitech, Inc., the disclosure of which is incorporated herein by reference in its entirety.

The circumferential MFL magnetizer 40 (which may also be referred to herein as the "CMFL section" or "CMFL module") is also coupled to the towing section 20 (via the axial MFL magnetizer 30 in FIG. 1), and is configured to impart a circumferentially oriented magnetic flux around the pipeline and detect any resulting flux leakage associated with defects or other anomalies in the pipeline. The defects and anomalies detected by the circumferential MFL magnetizer 40 are typically axial in nature. The circumferential MFL magnetizer 40 is somewhat similar to other circumferential MFL magnetizers as will be recognized by those of ordinary skill in the art. An exemplary embodiment of circumferential MFL magnetizer is also disclosed in U.S. Pat. No. 10,401,325, assigned to Novitech, Inc., the disclosure of which is incorporated herein by reference in its entirety. However, the CMFL module disclosed herein significant distinctions and advantages from other CMFL magnetizers, as explained in further detail below.

As best shown in FIGS. 2-4B, the circumferential MFL magnetizer 40 disclosed herein includes a body 46 with a central shaft 48, and a plurality of bar assemblies 41 arranged circumferentially around a central shaft 48. The body 46 provides a framework for the CMFL module 40, and may be comprised of a relatively strong yet lightweight material, such as aluminum or steel. The central shaft 48 generally extends from a front to a rear of the CMFL module 40. The body 46 forms a framework structure with portions surrounding the central shaft 48 that serve as mounting brackets for the magnetic bar assemblies 41.

Each of the bar assemblies 41 includes a forward magnetic bar structure 42 linked to a rearward magnetic bar structure 44 by an offset provided by an elbow 60 (which may alternatively be referred to as a "Z link" or "Z kink"). The elbow 60 provides an axial offset between the forward magnetic bar structure 42 (which may also be referred to herein as a "front bar structure" or "front bar portion") and the rearward magnetic bar structure 44 (which may alternatively be referred to herein as a "rear bar structure" or "rear bar portion"), while still maintaining a link between the forward and rearward bar assemblies 42, 44. Both the front bar structure 42 and the rear bar structure 44 are linear in form such that a general cross-sectional shape of the bar assembly is maintained relatively constant over a length of the bar structure. Accordingly each bar structure 42, 44 may be considered to extend along an elongation axis defined by the bar structure. For example, in the embodiment of FIG. 3, the front bar structure 42 may be considered to be linear along dotted line 43, and the rear bar structure may be considered to be linear along dotted line 45. The elbow 60 in each bar assembly 41 results in the front bar structure 42 being non-linear with the rear bar structure 44. This elbow 60 makes the entire bar assembly 41 generally non-linear because the front bar structure 42 is circumferentially offset from the second bar structure on the CMFL module 40. Stated differently, while the front bar structure 42 and the rear bar structure 44 remain together within one bar assembly 41 (i.e., as a unitary member), the circumferential offset provided by the elbow 60 introduces a kink in the bar assembly that would otherwise be linear in form if not for the elbow 60. Advantageously, the elbow 60 between the front bar structure 42 and the rear bar structure 44 facilitates uninterrupted magnetic fields in both the magnetizer bar assembly 41 and the pipeline, as explained in further detail herein.

Figure 2:
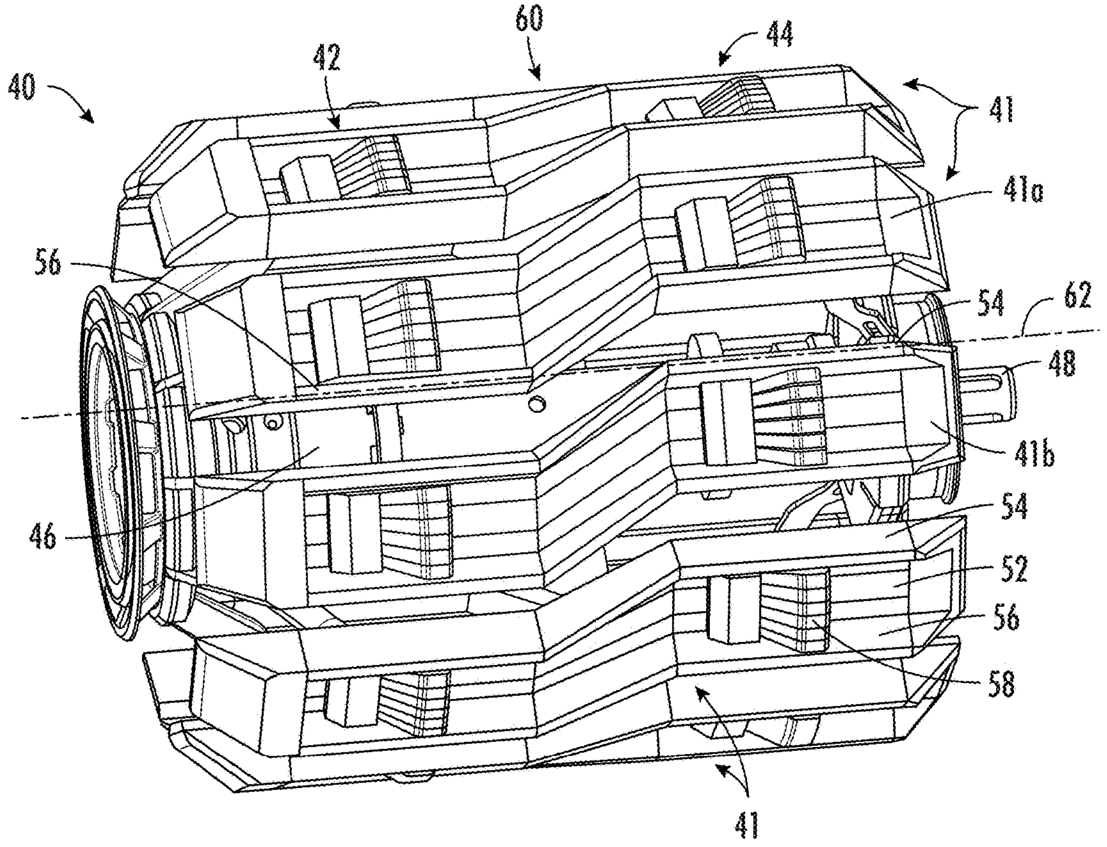
FIG. 2 shows a perspective view of the circumferential MFL magnetizer of FIG. 1.

The bar assemblies 41 shown in FIG. 2 are all single section type with a relatively significant bar offset provided by the elbow 60. Specifically, it will be recognized that the bar offset provided by the elbow 60 is large enough to create a significant offset between the front bar structure 42 and the rear bar structure 44. Each elbow 60 in the arrangement of FIG. 2 provides a counter-clockwise offset that is greater than five degrees (i.e., the elbow 60 offsets the bar assembly 41 in the counterclockwise direction more than 5° around the CMFL module 40 such that the rear bar structure 44 is shifted circumferentially more than 5° relative to the front bar structure 42). In at least some embodiments, the elbow 60 provides an offset between 5° and 30° in the counter-clockwise or clockwise directions.

As a result of the offset provided by the elbow 60, the circumferential magnetic arc covered by the front bar structure 42 and rear bar structure 44 overlap such that the combined circumferential magnetic arc of the two bar structures 42, 44 is greater than either of the front bar structure 42 and rear bar structure 44 alone. As particularly shown in FIG. 2, multiple bar assemblies 41 may be arranged around the central shaft 48 in a manner that results in a combined circumferential magnetic arc that extends completely around the module 40 and allows for the use of only one CMFL magnetizer module 40 in the pig.

With continued reference to FIGS. 2-4B, each forward and rearward magnetic bar structure 42, 44 includes a central magnet 52 (which may be provided as a magnet bar), a north pole structure 54, a south pole structure 56, and a plurality of magnetic flux sensors 58. The central magnet 52 is provided as a rectangular bar structure that extends axially along the bar assembly 41. The central magnet 52 may be any of various magnets known in the art for providing effective magnetic flux when used in a magnetic flux module, such as a ceramic magnet and/or rare earth magnets (e.g., neodymium magnets, ferrite magnets and/or samarium cobalt magnets). The central magnets 52 are configured to impart magnetic fields to the bar structures 42, 44.

Each north pole structure 54 is positioned on a north side of an associated magnet 52 (e.g., circumferentially to a counter-clockwise side of the magnet 52). Each north pole structure 54 is comprised of a ferromagnetic material and includes a base block portion 54*a* that abuts the north side of the magnet 52, and an outwardly extending panel 54*b* that extends radially outward from the base block portion 54*a* and the associated magnet 52. Similarly, each south pole structure 56 is positioned on a south side of the associated magnet 52. Each south pole structure 56 is comprised of a ferromagnetic material and includes a base block portion 56*a* that abuts the south side of the magnet 52, and an outwardly extending panel 56*b* that extends radially outward from the base block portion 56*a* and the associated magnet 52.

Each central magnet 52, north pole structure 54 and south pole structure 56 forms a V-shaped structure (i.e., a structure having a generally V-shaped or U-shaped cross-section). The space defined within the V-shaped structure may be referred to herein as a “V-space”. The outwardly extending panel 54*b* of the north pole structure 54 is angled relative to the outwardly extending panel 56*b* of the south pole structure 56. In at least some embodiments, the outwardly extending panel 54*b* of the north pole structure 54 is angled at least 10°, and commonly between 20° and 60°, relative to the outwardly extending panel 56*b* of the south pole structure 56. As best shown in FIG. 4B, the magnet bar assemblies are arranged in pairs to maintain repulsion between them and to generate magnetic flux between the north and south poles.

Figure 3:
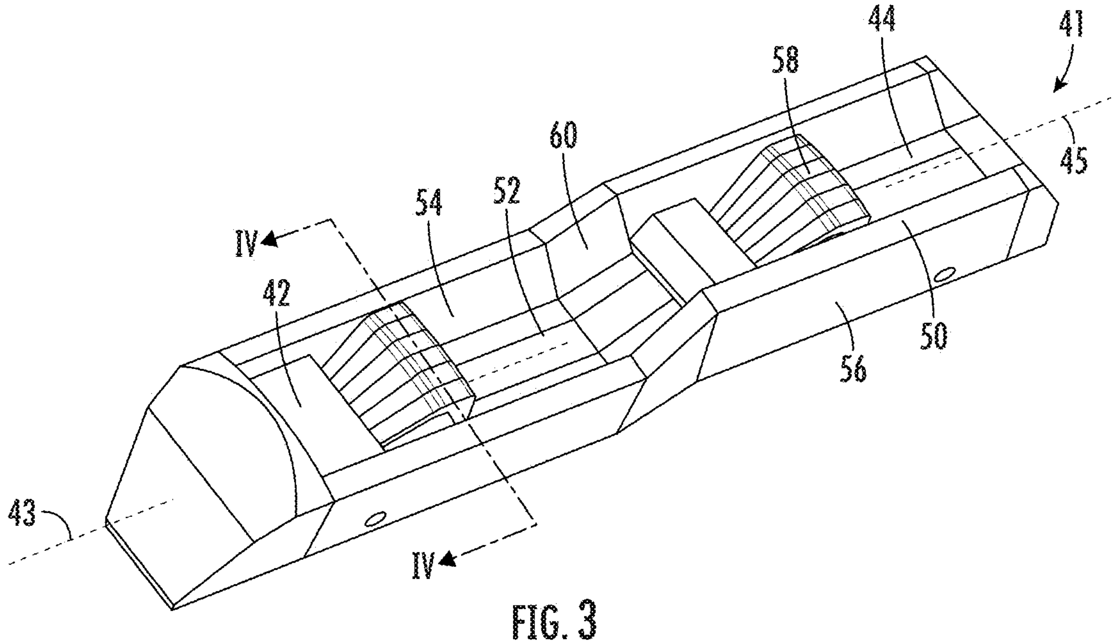
FIG. 3 shows an perspective view of a magnetizer bar assembly including a forward magnetizer bar structure, a middle elbow structure, and rearward magnetizer bar structure in isolation from other components of the circumferential MFL magnetizer of FIG. 2.
Figure 4A:
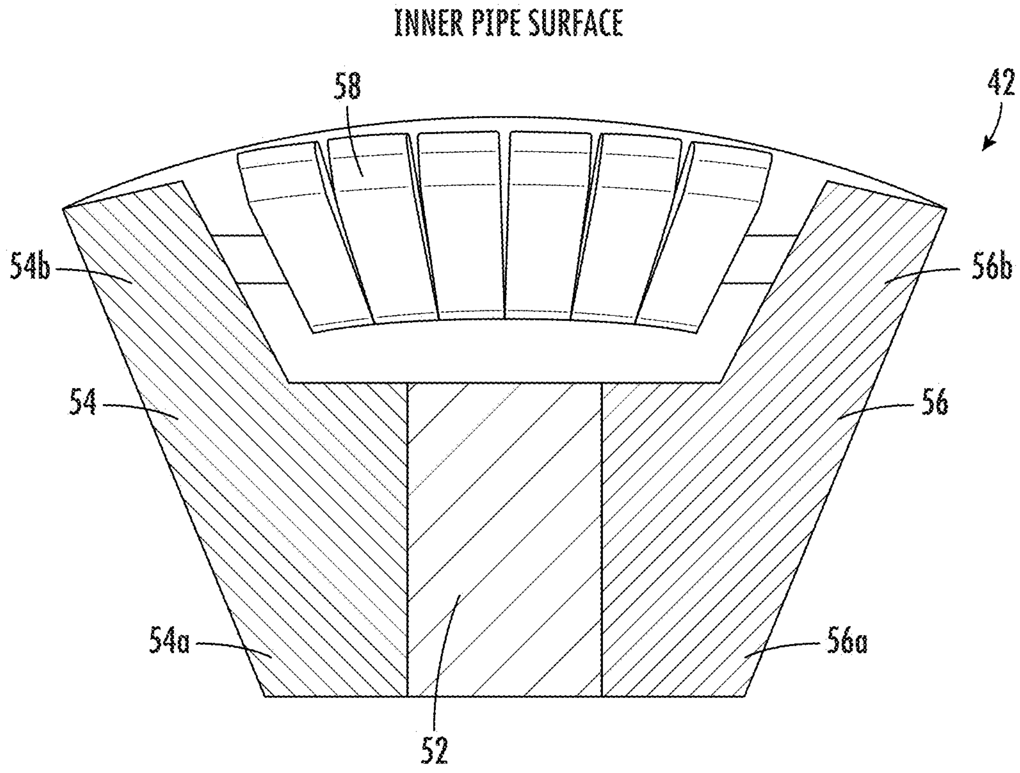
FIG. 4A shows a cross-sectional view of the magnetizer bar assembly along line IV-IV of FIG. 3.
Figure 4B:
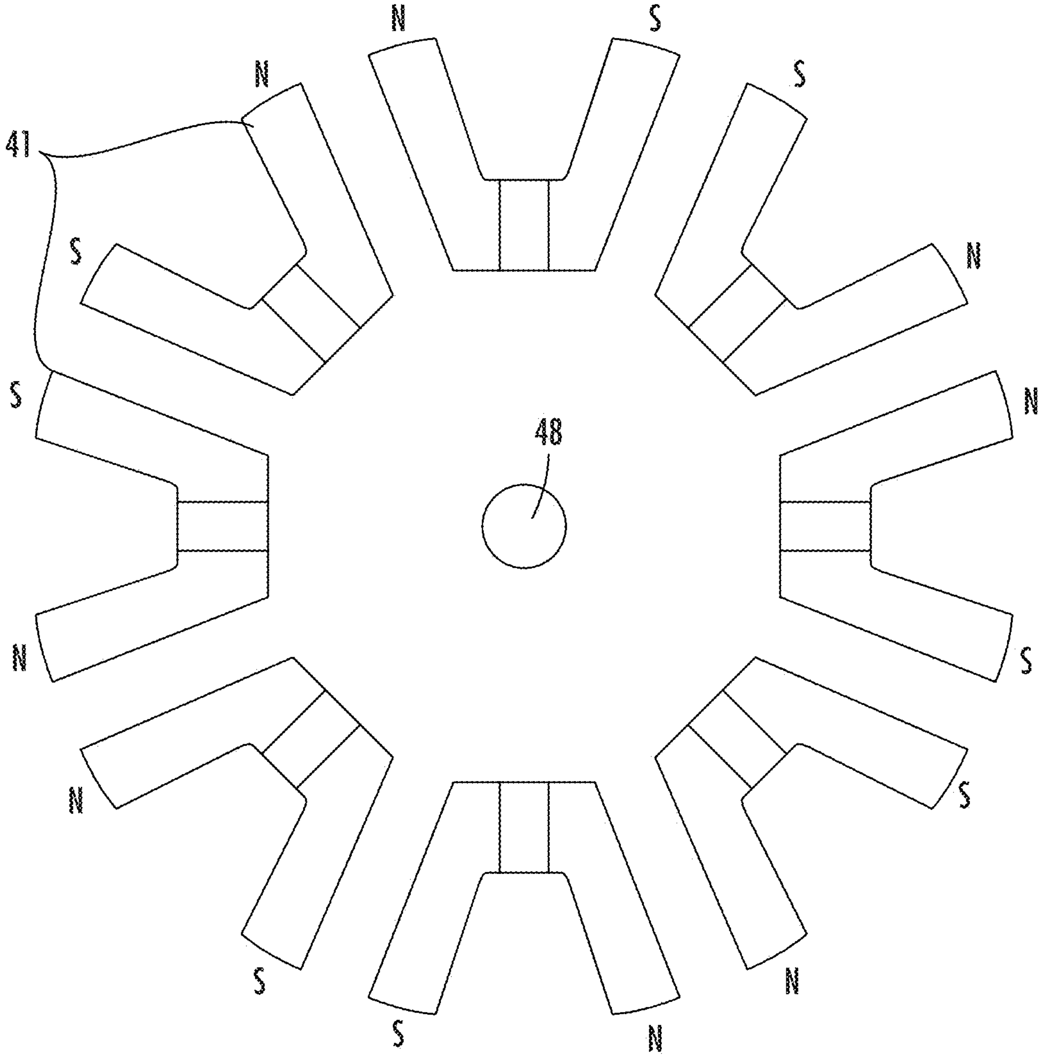
FIG. 4B shows a cross-sectional view of a plurality of magnetizer bars arranged circumferentially on a module.

As best shown in FIGS. 3 and 4A magnetic flux sensors 58 are arranged in a circumferentially extending row and positioned radially outward from the magnet 52 on the bar assembly 41, and circumferentially between the north pole structure 54 and the south pole structure 56 of the V-space. The magnetic flux sensor 58 more particularly located within the V-space between the outwardly extending panel 54*b* of the north pole structure 54 and outwardly extending panel 56*b* of the south pole structure 56. However, it will be recognized that in other embodiments, the sensors 58 may be arranged differently and/or placed anywhere alongside of the V-space and alongside the length of each bar structure 42, 44.

While only a single row of sensors 58 is disclosed in association with each magnetic bar structure 42, 44 in the embodiment of FIGS. 2-4B, it will be recognized that two or more rows/columns of sensors 58 are also possible for each magnetic bar structure 42, 44. As will be recognized by those of skill in the art, the magnetic flux sensors are configured to detect and measure the magnetic fields around the permanent magnets as the module 40 moves through the pipeline, wherein changes in the magnetic fields are often associated with defects in the pipeline. Springs (not shown) may be used to suspend the magnetic bar assemblies 41 to the center of the tool and/or against each adjacent magnet bar. Carbide or ceramic-based inserts or coatings can be used on contact surfaces 50 (see FIG. 3) in order to reduce wear during use of the pig 10.

Each elbow 60 is provided as a coupling section between the front bar structure 42 and the rear bar structure 44 of each bar assembly 41. In the embodiments disclosed herein, the elbows 60 have a similar cross-sectional shape as that of the front bar structure 42 and rear bar structure 44. Accordingly, each elbow 60 also includes a central magnet 52, a north pole structure 54, and a south pole structure 56, similar in cross-sectional shape to that of the front bar structure 42 and the rear bar structure 44, and comprised of the same or similar materials. In the embodiment of FIGS. 2-4B, the elbows 60 do not include magnetic sensors. However, in at least some embodiments, each elbow 60 may also include magnetic sensors 58 arranged in the V-space between the north pole structure 54 and the south pole structure 56.

While the elbow 60 of each bar assembly 41 has been described herein as having a similar structure and makeup as the front bar structure 42 and the rear bar structure 44, in other embodiments, the elbow 60 may be differently configured. For example, in at least some embodiments, the elbow 60 may not include a magnet and may be completely or mostly comprised of a ferromagnetic material (e.g., a ferromagnetic component that replaces the central magnet). In other embodiments, the elbow 60 may not include a magnet and may be a non-ferromagnetic material, such as a polymer material. In yet other embodiments, the elbow 60 can alternatively be made from non-magnetic material without a central magnet present for specific pipeline conditions.

As discussed previously, the elbow 60 of each bar assembly 41 allows the circumferential magnetic arc covered by the front bar structure 42 and rear bar structure 44 overlap such that the combined circumferential magnetic arc of the two bar structures 42, 44 is greater than either of the front bar structure 42 and rear bar structure 44 alone. For example, as illustrated by dotted line 62 in FIG. 2, the south pole structure 56 on the front bar structure 42 of bar assembly 41*a* is aligned with and/or overlaps the north pole structure 54 on the rear bar structure 44 of bar assembly 41*b*. With this overlapping arrangement of the bar assemblies 41, all of the bar assemblies 41 together are configured to provide a combined circumferential magnetic arc that extends completely around the module 40.

In view of the above, it will be recognized that the elbows 60 strategically afford more circumferential coverage for the bar assemblies 41 while also keeping heads of the magnetic sensors 58 inline and the magnetic path provided by the magnets 52 as short as possible and perpendicular to pipe axis (thus resulting in less distortion of the magnetic field). In at least some embodiments, the size of the elbows 60 on one CMFL magnetizer is such that only one circumferential magnetizer is required, thus greatly reducing operational complexity of the circumferential MFL magnetizer.

Figure 8A:
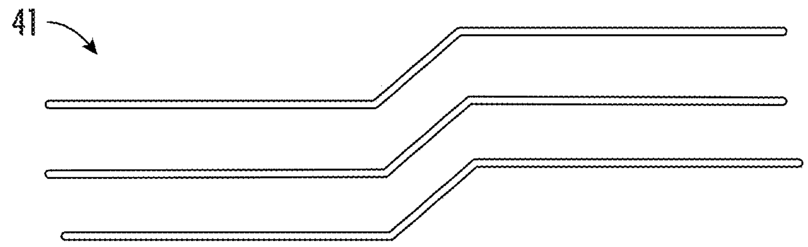
FIG. 8A shows an axial orientation of the magnetizer bar assembly on the circumferential MFL magnetizer.
Figure 8B:
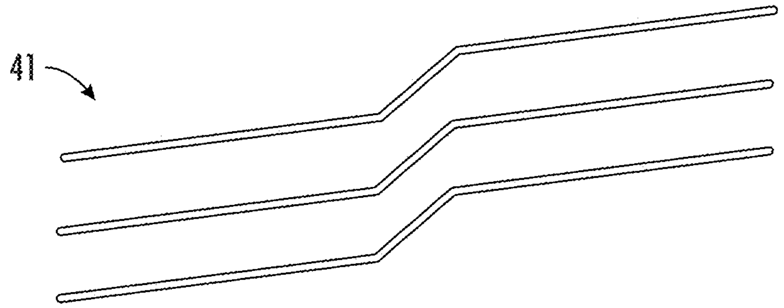
FIG. 8B shows a spiral orientation of the magnetizer bar assemblies.

Each elbow 60 disclosed in association with the embodiment of FIGS. 2-4B is in the form of straight line segment (i.e., a linear segment that results in a Z shape). In other embodiments, the elbow 60 may be gradually curved, S shaped, or have another irregular or non-linear shape. Furthermore, it will be recognized that the bar assemblies 42, 44 shown in the figures herein are generally oriented in an axial direction on the magnetizer, as illustrated in FIG. 8A. However, in at least some embodiments the elbow 60 can also be used with bar assemblies that are differently oriented, such as a spiral orientation, as illustrated in FIG. 8B. In these embodiments, the elbow 60 would reduce the spiral angle of the bar assemblies 40, 42, again reducing the circumferential magnetic flux's angle from being perpendicular to pipe axis. In each case, the elbow 60 can be configured to provide a clockwise or counter-clockwise offset between one forward magnetic bar structure 42 and the associated rearward magnetic bar structure 44.

While one exemplary embodiment of a CMFL module is shown herein in association with FIGS. 2-4B, it will be recognized that other arrangements are possible. For example, while the embodiments disclosed herein including only one circumferentially extending column (i.e., a column that encircles the CMFL magnetizer 40) of bar assemblies 41, with multiple rows of bar assemblies with one bar assembly 41 in each row of the column, embodiments with multiple circumferentially extending columns of bar assemblies are also contemplated. For example, in at least some embodiments the bar assemblies 41 may be arranged in two or more columns of the CMFL magnetizer with the bar assemblies of adjacent rows offset in different columns (i.e., the bar assemblies 41 staggered around the circumference of the magnetizer 40).

Figure 5:
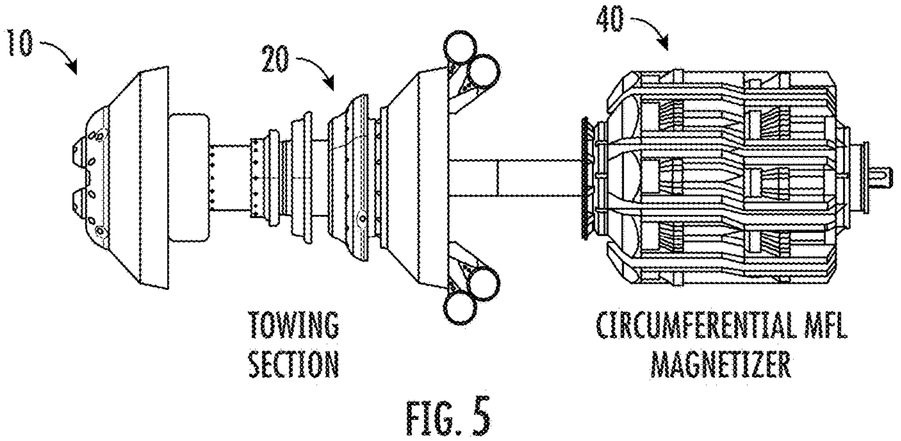
FIG. 5 shows a side view of an alternative embodiment of a pig including only a towing module and a circumferential MFL magnetizer.
Figure 6:
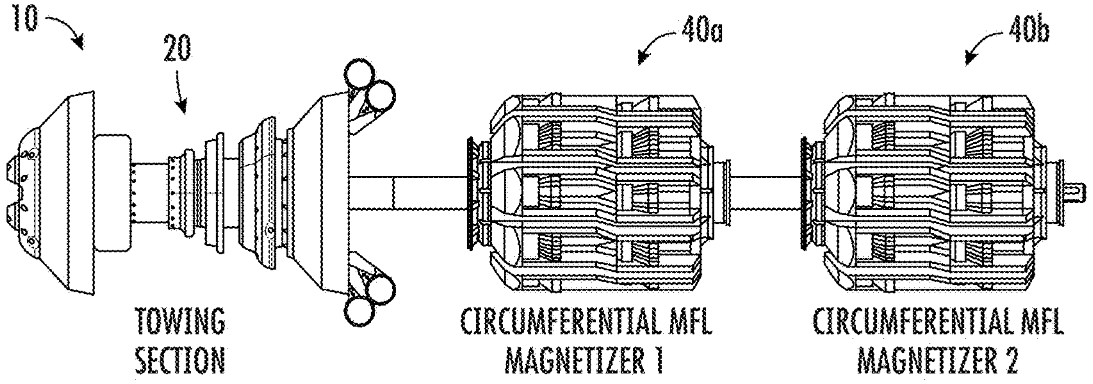
FIG. 6 shows a side view of another alternative embodiment of a pig including a towing module and two circumferential MFL magnetizers.
Figure 7:
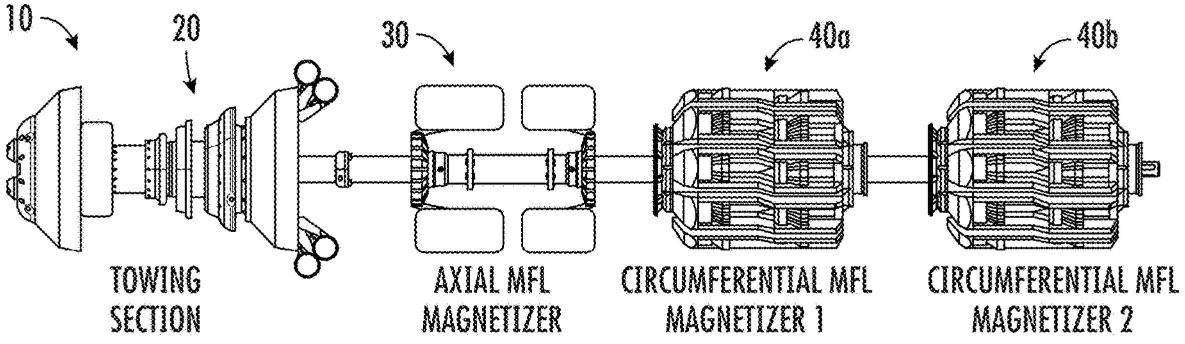
FIG. 7 shows a side view of another alternative embodiment of a pig including a towing module, an axial MFL magnetizer, and two circumferential MFL magnetizers.

In addition to recognizing that different embodiments CMFL module 40 are possible, it will be recognized that the CMFL module may be used in association with a pig having any of various modules. For example, as shown in FIG. 5, the pig 10 includes only a towing section 20 and the circumferential MFL magnetizer 40. Another example is shown in FIG. 6 wherein the pig 10 includes a towing section 20 and two circumferential MFL magnetizers 40*a*, 40*b* connected in series. Yet another example is shown in FIG. 7 wherein the pig 10 includes a towing section 20, an axial MFL magnetizer 30 and two circumferential MFL magnetizers 40*a*, 40*b* connected in series. The various sections of the pig 10 may be arranged in any desired configuration. For example, in FIG. 7, the axial MFL magnetizer could alternatively be positioned between the two circumferential MFL magnetizers 40*a* and 40*b*, or after the two circumferential MFL magnetizers 40*a* and 40*b*.

In addition to the foregoing, it will be recognized that different configurations of the CMFL modules are possible when two or more circumferential MFL magnetizers are utilized in a single pig. For example, the rear magnetizer 40*b* may have a reversed elbow 60 as compared to forward magnetizer 40*a*. Specifically, in the embodiments of FIGS. 6 and 7, the elbows 60 in the first circumferential magnetizer 40*a* provide a counter-clockwise offset between the forward magnetic bar assemblies 42 and the rearward magnetic bar assemblies 44, and the elbow 60 in the second circumferential magnetizer 40*b* provide a clockwise offset between the forward magnetic bar assemblies 42 and the rearward magnetic bar assemblies 44. This configuration advantageously negates possible rotation tendencies due to the elbow, and may be used to additionally ensure that all circumferential portions of a pipeline are properly covered by the pig.

As noted previously, the elbow 60 between the front bar structure 42 and the rear bar structure 44 facilitates uninterrupted magnetic fields in the magnetizer bar assembly 41 and the pipeline. Without the elbow, there would be a significant interruption between the two rows of bar structures (i.e., between the front bar structure 42 and the rear bar structure 44). The elbow 60 thus provides a stronger and more uniform magnetic field, and particularly for the rear sensors 58. The rotational shift between the sensors 58 of the front bar structure 42 and the sensors 58 of the rear bar structure 44 allows for uniform coverage of the entire circumference of the pipe (without gaps). Furthermore, the overall pig tool is shorter, requiring less force to propel it through the pipeline, and allowing it to more easily navigate over features encountered within the pipeline.

Figure 8C:
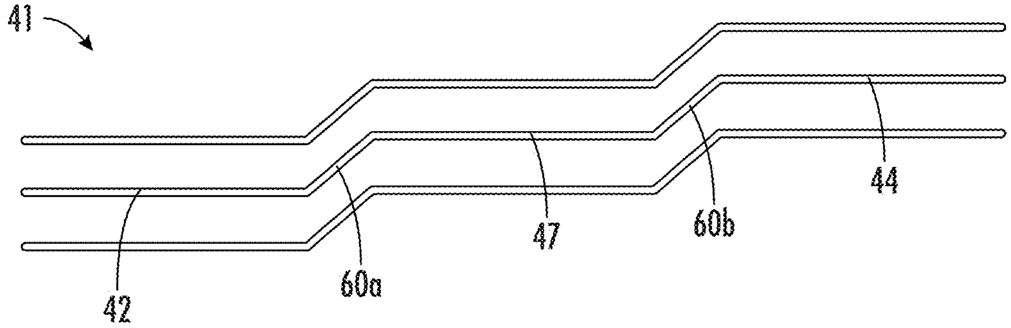
FIG. 8C shows an axial orientation of a magnetizer bar assembly including a middle magnetizer bar structure.

The foregoing detailed description of one or more embodiments of the inspection module for a pipeline inspection gauge have been presented herein by way of example only and not limitation. It will be recognized that there are advantages to certain individual features and functions described herein that may be obtained without incorporating other features and functions described herein. Moreover, it will be recognized that various alternatives, modifications, variations, or improvements of the above-disclosed embodiments and other features and functions, or alternatives thereof, may be desirably combined into many additional different embodiments, systems or applications. For example, while the previously disclosed embodiments only show each bar assembly 41 with a front bar structure 42 and a rear bar structure 44 with an elbow 60 in between, it will be recognized that additional arrangements for bar assemblies are possible, such as that shown in FIG. 8C, wherein the bar assembly 41 includes a front bar structure 42 followed by a first elbow 60*a*, a middle bar structure 47 followed by a second elbow 60*b*, and then the rear bar structure 44 (i.e., each bar assembly may include three or more segments and two or more elbows). It will be recognized that numerous other modifications are also possible and result in additional embodiments. Furthermore, presently unforeseen or unanticipated alternatives, modifications, variations, or improvements therein may be subsequently made by those skilled in the art which are also intended to be encompassed by the appended claims. Therefore, the spirit and scope of any eventually appended claims should not be limited to the description of the embodiments contained herein.

What is claimed is:

1. A circumferential magnetic flux leakage (CMFL) module for a pipeline inspection gauge, the CMFL module comprising:

a body defining a central axis; and a plurality of magnetic bar assemblies arranged circumferentially on the body with respect to the central axis, each of the plurality of magnetic bar assemblies including a front bar structure and a rear bar structure with an elbow positioned between the front bar structure and the rear bar structure, wherein the elbow provides a circumferential offset between the front bar structure and the rear bar structure, and wherein each of the front bar structure and the rear bar structure includes a central magnet, a north pole structure, a south pole structure, and a plurality of magnetic flux sensors.

2. The CMFL module of claim 1, wherein the elbow is comprised of a ferromagnetic material.

3. The CMFL module of claim 1 wherein the elbow is comprised of a non-ferromagnetic material.

4. The CMFL module of claim 1, wherein the circumferential offset between the front bar structure and the rear bar structure is between 5° and 30°.

5. The CMFL module of claim 1, wherein the elbow also includes a central magnet, a north pole structure, and a south pole structure.

6. The CMFL module of claim 1, wherein the central magnet, the north pole structure, and the south pole structure of each of the plurality of magnetic bar assemblies form a V-shaped structure.

7. The CMFL module of claim 1, wherein the north pole structure and the south pole structure are comprised of a ferromagnetic material.

8. The CMFL module of claim 1, wherein the north pole structure includes a base block portion and an outwardly extending panel, wherein the south pole structure includes a base block portion and an outwardly extending panel.

9. The CMFL module of claim 8, wherein the outwardly extending panel of the north pole structure is angled at least 10° relative to the outwardly extending panel of the south pole structure.

10. The CMFL module of claim 8, wherein the plurality of magnetic flux sensors are positioned radially outward from the central magnet in a V-space defined between the outwardly extending panel of the north pole structure and the outwardly extending panel of the south pole structure.

11. The CMFL module of claim 1 wherein the plurality of magnetic bar assemblies are arranged in alternating columns on the body of the CMFL module.

12. A pipeline inspection gauge comprising:
- a towing section; and
- at least one circumferential magnetic flux leakage (CMFL) module coupled to the towing section, the at least one CMFL module comprising:
  - a body defining a central axis; and
  - a plurality of magnetic bar assemblies arranged circumferentially on the body with respect to the central axis, each of the plurality of magnetic bar assemblies including a front bar structure and a rear bar structure with an elbow positioned between the front bar structure and the rear bar structure, wherein the elbow provides a circumferential offset between the front bar structure and the rear bar structure, and wherein each of the front bar structure and the rear bar structure includes a central magnet, a north pole structure, a south pole structure, and a plurality of magnetic flux sensors.

13. The pipeline inspection gauge of claim 12 further comprising at least one axial magnetic flux leakage module coupled to the towing section.

14. The pipeline inspection gauge of claim 12 wherein the least one CMFL module includes a first CMFL module and a second CMFL module on the pipeline inspection gauge.

15. The pipeline inspection gauge of claim 14 wherein each elbow on the first CMFL module has a clockwise offset such that it shifts an associated magnetic bar assembly of the plurality of magnetic bar assemblies in a clockwise direction on the first CMFL module, and each elbow on the second CMFL module has a counter-clockwise offset such that it shifts another associated magnetic bar assembly in a counter-clockwise direction on the second CMFL module.

16. The pipeline inspection gauge of claim 12 wherein the central magnet, the north pole structure, and the south pole structure of each of the plurality of magnetic bar assemblies form a V-shaped structure.

17. The pipeline inspection gauge of claim 16, wherein the north pole structure includes a base block portion and an outwardly extending panel, wherein the south pole structure includes a base block portion and an outwardly extending panel, and wherein the outwardly extending panel of the north pole structure is angled at least 10° relative to the outwardly extending panel of the south pole structure.

18. The pipeline inspection gauge of claim 17, wherein the plurality of magnetic flux sensors are positioned radially outward from the central magnet in a V-space defined between the outwardly extending panel of the north pole structure and the outwardly extending panel of the south pole structure.

19. A circumferential magnetizer configured for insertion in a fluid pipeline, the circumferential magnetizer comprising:
- a body defining a central axis; and
- a plurality of magnetic bar assemblies arranged circumferentially on the body with respect to the central axis, each of the plurality of magnetic bar assemblies including a linear front bar structure and a linear rear bar structure with an offset positioned between the front bar structure and the rear bar structure such that the front bar structure and the rear bar structure are non-linear, wherein each of the front bar structure and the rear bar structure includes:
- a central magnet,
- a north pole structure,
- a south pole structure, and
- at least one magnetic flux sensor.

20. The circumferential magnetizer of claim 19 wherein the at least one magnetic flux sensor includes
- a plurality of magnetic flux sensors.

* * * * *